United States Patent [19]

Edwards et al.

[11] Patent Number: 4,586,743
[45] Date of Patent: May 6, 1986

[54] ROBOTIC GRIPPER FOR DISK-SHAPED OBJECTS

[75] Inventors: Alan T. Edwards; Steven A. Smith, both of Corvallis, Oreg.

[73] Assignees: Intelledex Incorporated, Corvallis, Oreg.; Applied Materials, Inc., Santa Clara, Calif. ; a part interest

[21] Appl. No.: 654,306

[22] Filed: Sep. 24, 1984

[51] Int. Cl.$^4$ .............................................. B25J 15/00
[52] U.S. Cl. .................................. 294/86.4; 414/729
[58] Field of Search ............... 294/86.4, 871, 119.3, 294/98.1, 907, 106; 414/730, 735, 729; 901/30, 39, 33; 3/12.7, 12.6, 12.8; 269/254, 109

[56] References Cited

U.S. PATENT DOCUMENTS 4,453,757  6/1984  Soraoka ............................... 294/86.4
4,500,126  2/1985  Tur-Kaspa et al. ................. 294/86.4

Primary Examiner—James B. Marbert

[57] ABSTRACT

A robotic gripper for transporting an object such as a disk-shaped integrated circuit wafer by contacting and gripping only its edge surface. The robotic gripper includes a plurality of elongated fingers which are joined together at a central location from which they project outward in the shape of the letter "X" to their fingertips. Each fingertip may be individually extended outward from or retracted inward to the edge surface of the object to be transported. To adapt the fingertips for grasping the edge of disk-shaped integrated circuit wafers, each fingertip is formed with a projecting lip having a V-shaped notch into which a wafer's edge surface is received while it is being gripped. Each finger includes a bellows through which a cable communicates force from a remote motor to the fingertip. A housing encloses cables and gears used to move the cable.

23 Claims, 11 Drawing Figures

4,586,743

ROBOTIC GRIPPER FOR DISK-SHAPED OBJECTS

TECHNICAL FIELD

The present invention relates generally to the field of robotic materials handling and more particularly to devices for precisely picking up, holding and releasing an object by engaging only its edge surface.

BACKGROUND ART

Presently, silicon wafers, the raw material from which most micro-electronic integrated circuit chips are fabricated, are generally a planar, disk-shaped object approximately 0.025 inches thick having a diameter between 3 and 6 inches. Fabricating such a wafer begins with sawing across a cylindrically-shaped single crystal boule of extremely pure silicon material along a particular crystallographic axis to produce these thin, circular slices. Usually the wafer thus produced does not have a continuous circular periphery but rather is fabricated with one or two reference marks such as flats or notches on its periphery which establish its crystallographic orientation. These reference marks can also be used to facilitate mechanically orienting it during integrated circuit fabrication.

Before the fabrication of individual integrated circuits may commence, further processing of the silicon wafer's planar surfaces is necessary. First the rough-sawed wafer is usually lapped to remove most of a layer of stressed material formed on its planar surfaces by the sawing operation. Then the wafer will be processed in an acid etch to remove the remainder of the stress-damaged material. Finally, one entire planar surface of the wafer will usually be processed with a doping material to uniformly establish a particular desired electrical characteristic. This doped planar surface of a wafer is generally referred to as the wafer's "frontside." The other planar surface of the wafer which has not been doped is generally referred to as its "backside." This initial doping operation is generally performed on the raw silicon wafers before they are shipped to an integrated circuit factory. However, the precise character of the doping cannot be established by merely inspecting the wafer. Rather, costly analytical testing is required to determine a wafer's doping if this property is unknown. Consequently, such doped raw silicon wafers are generally shipped in carefully organized batches of wafers to permit the easy determination of their doping without resorting to analytical testing. Further, within the integrated circuit factory wafers must be handled carefully to preserve the character of their doping.

Considering the mechanical structure of a silicon wafer, it is seen that the wafer constitutes a uniformly thick circular membrane having a diameter approximately 400 times greater than its thickness. When handled manually, wafers are generally grasped at one location along their periphery with a tweezer having "duck bill shaped" tips to distribute the gripping force over a relatively large area. When thus grasped, the wafer's mechanical structure may be considered to be that of a horizontally cantilevered beam subject to the force of gravity which has a length several hundred times greater than its thickness. While silicon is a comparatively strong material, it is also rather brittle and consequently this thin membrane or long beam is relatively fragile. Therefore, during integrated circuit fabrication silicon wafers are handled carefully both to prevent scratching the planar surfaces on which the integrated circuit chips are fabricated but also to prevent chipping the wafer's circular edge. Edge chips are particularly damaging to a silicon wafer because of the high temperature processing used in integrated circuit fabrication. If a wafer has a chipped edge, it will frequently crack during this high temperature processing due to stresses originating at the chipped portion of its edge. In addition to requiring that the wafer be properly oriented with respect to the crystallographic axes of the silicon crystal, that the wafer be essentially stress free, that one of its planar surfaces be properly doped, that the identity of the doping be preserved, and that the wafer remain scratch and chip free, fabricating integrated circuits with a high yield of good chips requires that its doped surface be kept extremely clean.

Within the integrated circuit factory, the cleanliness required for high yield chip manufacture is obtained by performing all the fabrication operations in a clean room environment. This clean room environment is principally established and maintained by a constant laminar flow circulation of air through ultra-pure filters located in the ceiling, then downward through the volume of the room and finally out of the room through a porous floor. In time this downward laminar flow of air establishes the clean room environment by driving the contaminants from the room and/or trapping them in recesses within the room from which they cannot escape. However, those particles which inevitably remain in the clean room despite this laminar air flow and do not pass out of the room through its floor tend to settle on the horizontal surfaces within the room just as dust settles onto a polished wood table in a home.

While by most normal human standards the air in an integrated circuit factory clean room is very clean, integrated circuit manufacturers are constantly striving to reduce contamination within their clean rooms because improved cleanliness increases the yield of good integrated circuit chips. Further, each advance in integrated circuit manufacture which reduces the size of the chips or correspondingly allows the manufacture of ever more complicated chips imposes ever more stringent requirements on cleanliness to achieve an economically acceptable yield of good integrated circuit chips. Because the workers present in the clean room of an integrated circuit factory are a highly significant if not the major source of contamination, the present trend in achieving the higher levels of cleanliness required for advanced, very large scale integrated circuit manufacturing is to automate wafer processing as much as possible so fewer workers need be in the clean room environment.

This semi-automatic or even fully automatic integrated circuit manufacturing requires that the wafer processing machines be capable of transporting the disk-shaped silicon wafers. To prevent scratching the wafer's doped planar surface or chipping its edge and to support it in a low-stress condition free from excessive gravitational loading, presently available automatic wafer processing equipment is generally designed to handle silicon wafers by contacting only the wafer's comparatively large backside planar surface. While the automatic wafer handling structure incorporated into various wafer processing machines varies depending upon the particular operation to be performed and the particular devices used to perform it, presently such machines are designed to transport the wafer to locations lying only in a single, horizontal planar surface. Generally horizontal wafer tracks are used to provide rectilinear movement for the wafer between the machine's various processing stations. While a wafer is located on this wafer track, its backside generally rests on elongated, moving rubber bands or on an upwardly directed flow of air. With either rubber band or air wafer tracks it is impossible to maintain a wafer's orientation while it is being transported. Consequently, if an apparatus such as a photolithography machine employs a wafer track for handling the wafers and also requires that the wafer be held in a particular orientation during processing, then the apparatus must also include a device for properly orienting the wafer at the site where it is processed.

Between processing operations, whether performed manually or by an automatic wafer processing machine, integrated circuit wafers are generally kept in a "wafer carrier," an elongated, rectangular cassette having one open side in which a plurality of disk-shaped wafers are individually received into separate slots in a side-by-side arrangement. Automatic wafer processing machines are generally designed to accept wafers for processing directly from an input wafer carrier and are similarly designed to deliver processed wafers directly to an output wafer carrier. The device for introducing wafers into an automatic wafer processing machine or receiving them from that machine is generally an elevator type of device which includes a tower adapted to receive an entire wafer carrier with the wafer's planar surfaces oriented horizontally. This elevator apparatus then sequentially raises or lowers the wafer carrier a distance equal to the spacing between adjacent wafers to allow individually transferring wafers from the carrier to the horizontal wafer track or conversely. While this horizontal, planar surface approach to wafer handling devices avoids exposing the wafers to excessive mechanical stress and/or edge chipping, maintaining the wafer in a horizontal position during processing exposes it to the greatest possibility of contamination possible due to dust particles present in the laminar flow of air passing downward through the clean room.

Minimizing an integrated circuit wafer's exposure to contamination from dust particles present in a clean room's downwardly directed laminar air flow may be achieved by orienting the wafer's planar surfaces vertically rather than horizontally. Such vertical handling also reduces the mechanical stress of gravitational loading on the wafer because the force of gravity now acts parallel to the wafer's planar surfaces rather than perpendicular to them. At normal room atmospheric pressure, wafers may be transported by a vacuum chuck in such a vertical orientation as well as in virtually any other orientation while contacting only a wafer's backside. Further, a vacuum chuck wafer handling system is, in principle, capable of preserving a wafer's orientation as it is transported. However, the current trend in integrated circuit wafer processing is away from wet chemical processing at a normal atmospheric pressure. Rather, modern integrated circuit manufacture increasingly relies on dry processing because of its ability to delineate the very small features necessary to fabricate the components needed for very large scale integrated circuits and to fabricate structures having very high aspect ratios, i.e. the ratio of a structure's height to its width. Since such dry processing is generally performed at relatively low pressures, i.e. in a vacuum, a vacuum chuck which grips a wafer due to the pressure of the surrounding atmosphere urging the wafer toward the chuck is incapable of handling wafers within a dry processing apparatus.

DISCLOSURE OF INVENTION

An object of the present invention is to provide a robotic gripper for picking up, supporting and releasing an object disposed in any orientation by contacting only the object's edge surface.

Another object of the present invention is to provide a means for transporting an object which preserves that object's orientation.

Another object of the present invention is to provide a robotic gripper for picking up, supporting and releasing thin, disk-shaped objects in a manner wherein wear particles are confined and do not contaminate a transported object.

Another object of the present invention is to provide a robotic gripper for picking up, supporting and releasing a thin, disk-shaped object disposed in any orientation which may be used in a vacuum environment.

Another object of the present invention is to provide a means for transporting integrated circuit wafers which preserves the orientation of the wafers as they are processed.

Briefly, the present invention is a robotic gripper for transporting an object, such as a disk-shaped integrated circuit wafer, by picking it up, supporting it and releasing it. The robotic gripper includes a plurality of fingers which are mechanically joined together into a unitary assembly. The tip of each such finger may be individually extended outward from or retracted inward to the edge surface of the object to be transported. Thus, the robotic gripper may hold an object for transporting it by contacting only the object's edge surface. Fingertips are movable relative to the fingers by means of a bellows which forms a sealed, flexible or extensible connection. The fingers are hollow, with control cables for the tips extending therethrough. By enclosing cables, wear surfaces cannot contaminate objects being handled. The robotic gripper is connected to a wrist which rotates about two orthogonal axes to position an object at any selected elevation and/or azimuth. Being a robotic device, all operations performed by the robotic gripper are completely under computer control. Additionally, the use of a computer provides the capability of tracking the identity of items as they are transported.

In its preferred embodiment especially adapted for transporting disk-shaped integrated circuit wafers, the robotic gripper includes four fingers which are coplanar and are joined together at a single location substantially equidistant from the tips. The fingers of this robotic gripper project radially outward from the single location at which they are joined together to form an X shape with the finger tips dividing the circumference of the wafer's shape into a plurality of arcs. Each finger tip of this robotic gripper projects outward perpendicular to the plane of the fingers and includes a V-shaped notch into which a wafer's edge surface is received. Thus when this particular robotic gripper transports an integrated circuit wafer it contacts the wafer's edge surface at only four points with these V-shaped notches. Because this robotic gripper holds the edge surface of the integrated circuit wafers, the gripper preserves a wafer's orientation while it is being transported and may transport wafers within a vacuum environment. Further, the fingers of this preferred embodiment and their tips are sufficiently thin that integrated circuit wafers may be taken from and delivered to a wafer carrier.

An advantage of the present invention is that it provides a robotic gripper which may pick up, support and release an object while the object is disposed in any orientation by contacting only the object's edge surface.

Another advantage of the present invention is that it provides a means for transporting an object which preserves that object's orientation.

Another advantage of the present invention is that it provides a robotic gripper for picking up, supporting and releasing thin, disk-shaped objects which reduces the mechanical stress to which such objects are exposed.

Another advantage of the present invention is that it provides a robotic gripper for picking up and delivering integrated circuit wafers to a wafer carrier wherein such wafers are held in a vertical side-by-side orientation without contacting the planar surfaces of immediately adjacent wafers.

Another advantage of the present invention is that it provides a robotic gripper for picking up, supporting and releasing a thin, disk-shaped object disposed in any orientation which may be used in a vacuum environment.

Another advantage of the present invention is that it provides a means for transporting integrated circuit wafers which preserves the identity of the wafers as they are processed.

A further advantage of the present invention is that wear surfaces are sealed to prevent particle generation.

BRIEF DESCRIPTION OF THE DRAWINGS

FIG. 5c is an exploded view of the pulley assembly shown in FIG. 5a.

BEST MODE FOR CARRYING OUT THE INVENTION

Figure 1:
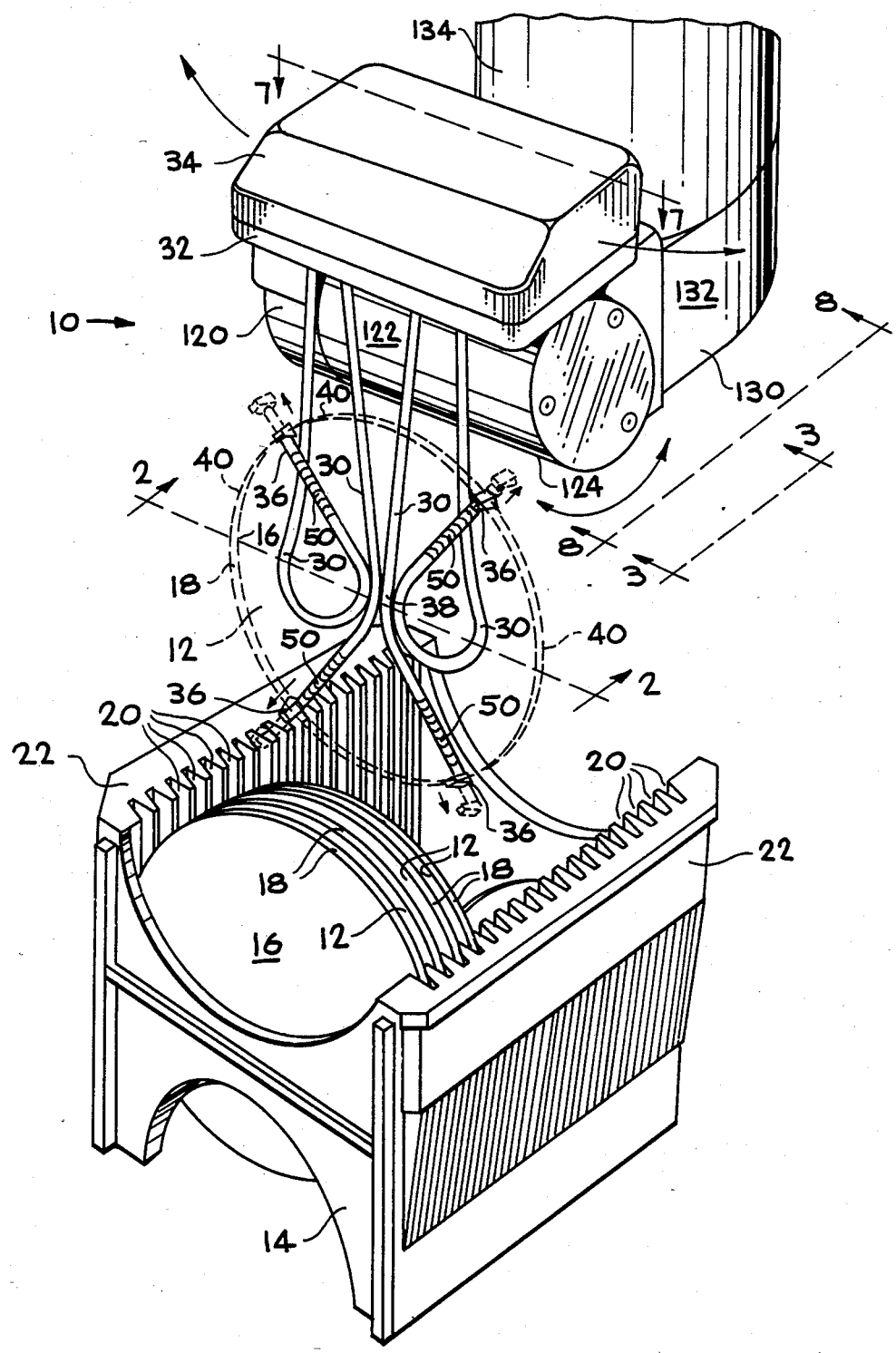
FIG. 1 is a diagramatic perspective view of a robotic gripper in accord with the present invention depicting the gripper taking an integrated circuit wafer from or delivering it to a wafer carrier.

FIG. 1 depicts a robotic gripper, referred to by the general reference number 10, in accordance with the present invention. The robotic gripper 10 is shown in FIG. 1 as it may be used for taking an integrated circuit wafer 12 from or delivering it to a wafer carrier 14. As described in greater detail above, the integrated circuit wafer 12 is a thin, planar, disk-shaped object having two parallel, circular planar surfaces 16 and a cylindrically shaped edge surface 18. The wafer carrier 14 is an elongated, rectangular cassette having a plurality of elongated parallel slots 20 formed on the interior surfaces of two of its parallel walls 22. The slots 20 are formed on the opposing faces of the wall 22 in mated pairs to receive a plurality of integrated circuit wafers 12. When properly received within the wafer carrier 14, the integrated circuit wafers 12 are disposed with their planar surfaces 16 parallel to each other in a side-by-side arrangement and with a segment of their edge surfaces 18 enclosed within each slot 20. The wafer carrier 14 is formed without a wall closing one of its faces spanning between the slots 20, i.e. the upper wall in FIG. 1. Thus, integrated circuit wafers 12 may be taken from or delivered into the wafer carrier 14 through that open face by sliding the integrated circuit wafers 12 along mated pairs of slots 20.

Figures 2, 3:
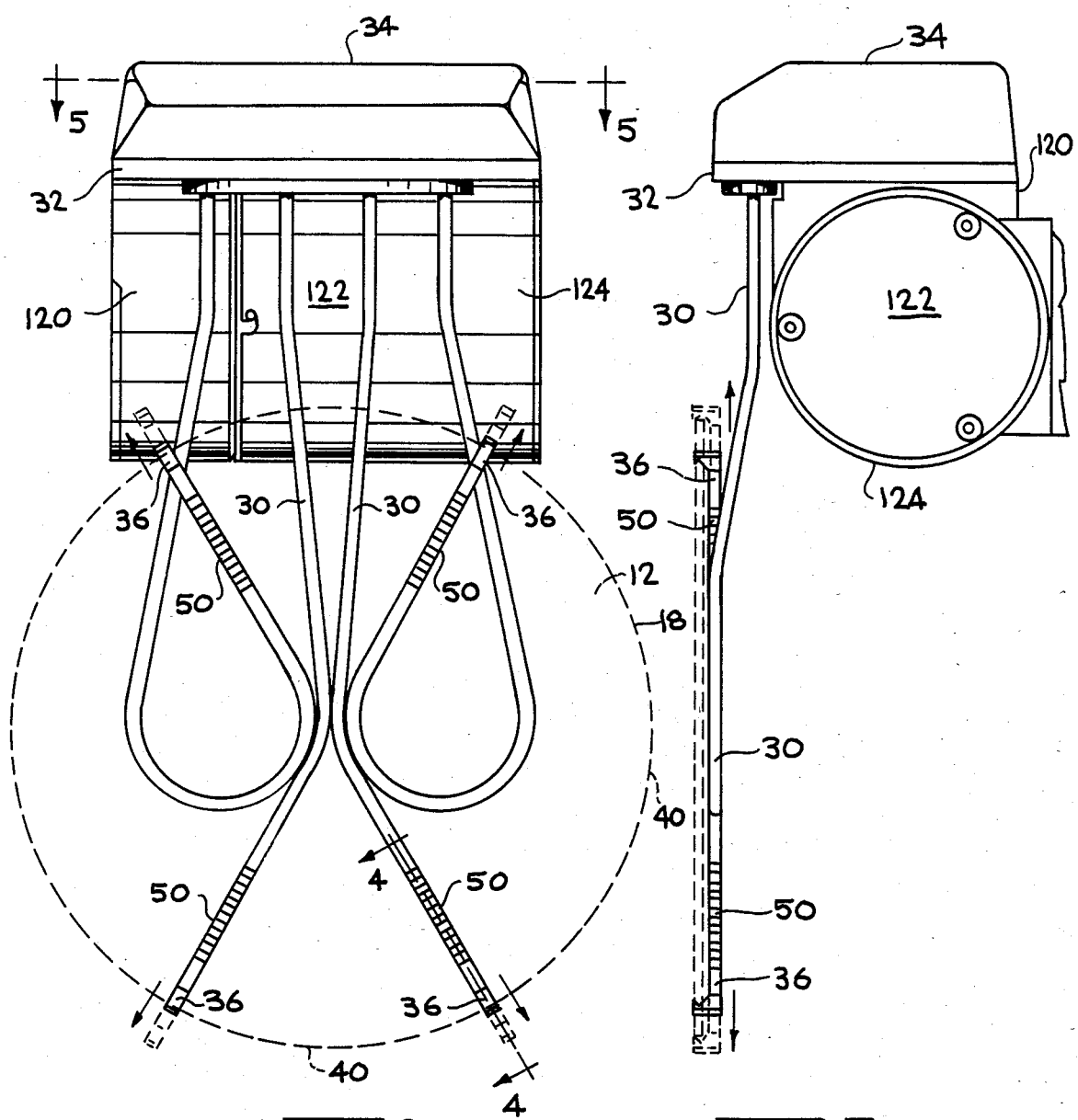
FIG. 2 is a diagramatic plan view of the robotic gripper taken along the lines 2—2 of FIG. 1 which shows its X-shaped fingers.
FIG. 3 is a diagramatic plan view of the robotic gripper taken along the lines 3—3 of FIG. 1 showing the planar arrangement of the fingers.

Referring now to FIGS. 2 and 3, the robotic gripper 10 includes four slender, curved, hollow fingers 30 which project downward below a base plate 32 of a fingertip control assembly 34 from which the fingers 30 depend. Located at the end of each finger 30 furthest from the base plate 32 is a fingertip 36. Between the base plate 32 and the fingertips 36, the curved fingers 30 are joined together into a unitary assembly at a single location 38 lying within the perimeter of the area enclosed by a polygon having its vertices at each of the four fingertips 36. Within the area enclosed by the fingers 30, all four fingers 30 are shaped and joined together to be coplanar. Between the location 38 and the fingertips 36 the fingers 30 are formed as substantially straight segments of an X-shaped figure in which those straight segments are radii of the disk-shaped integrated circuit wafer 12. Thus the fingers 30 locate the fingertips 36 at points which divide the circumference of the disk-shaped integrated circuit wafer 12 into a plurality of arcs 40.

Figure 4:
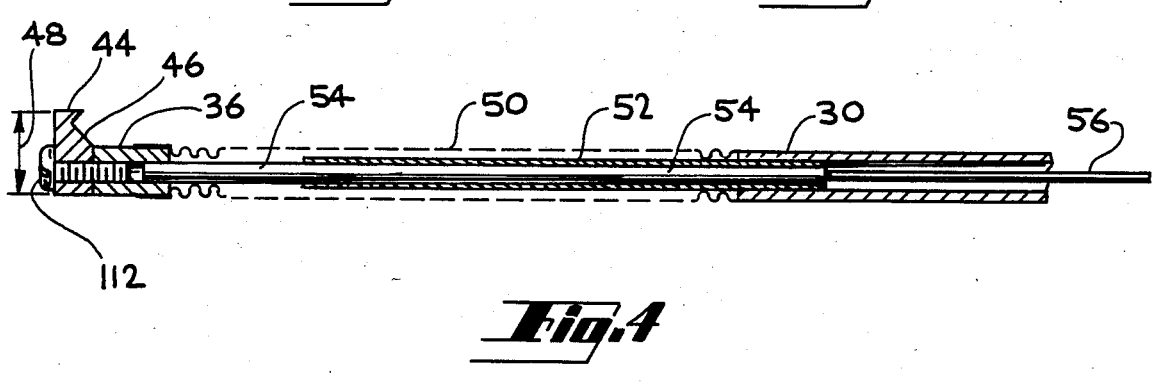
FIG. 4 is a diagramatic cross-sectional view of a segment of a finger taken along the lines 4—4 of FIG. 2 depicting the actuator means which allows the finger's tip to be extended outward from or retracted inward to an object's edge surface.

Referring now to FIG. 4, secured to the outermost end of the finger 30 by a screw 42 is a lip 44 which projects outward from the plane established by the fingers 30. The lip 44, thus attached at the outermost end of each finger 30, is formed with a V-shaped notch 46 directed inward from the fingertip 36 thereby adapting the fingertip 36 to receive the edge surface 18 of an integrated circuit wafer 12.

The tips 36 of the fingers 30 are adapted to be actuated for gripping the integrated circuit wafer 12. Actuation of the fingertips 36 extends them outward from or retracts them inward to the edge surface 18 of the integrated circuit wafer 12. In FIGS. 1, 2 and 3, the fingertip 36 are shown by solid lines in their retracted position and by dashed lines in their extended position with outward directed arrows indicating the extension of the fingertip 36 from their retracted position. Referring again to FIG. 4, to adapt the fingers 30 for extending and retracting the fingertips 36, the outer surface of each finger 30 includes an elongated, hollow bellows 50 located along the substantially straight segment of their length between the fingertips 36 and the location 38 at which the fingers 30 are joined together. Enclosed immediately within the bellows 50 is a hollow bushing 52 which extends from the end of the bellows 50 furthest from the fingertip 36, where it has an end fixed to the inside periphery of the finger, outward toward the fingertip 36 throughout most of the length of the bellows 50. Enclosed within the hollow bushing 52 is a sliding rod 54 which is secured at one end to the fingertip 36 and extends inward from the fingertip 36 throughout the lengths of both the bellows 50 and the bushing 52. Secured to the end of the sliding rod 54 furthest from the fingertip 36 within the hollow finger 30 is a control cable 56.

The bellows 50 of each finger 30 applies a force to the fingertip 36 urging it to extend outward and drawing with it the sliding rod 54 which moves outward guided within the bushing 52. Alternatively, if a force is applied to the control cable 56 directed inward from the fingertip 36, that force will be coupled to the fingertip 36 by the sliding rod 54. If the force thus applied to the fingertip 36 by the control cable 56 is sufficiently strong it will overcome the outwardly directed force applied to the fingertip 36 by the bellows 50. Thus a sufficiently strong force applied to the fingertip 36 by the control cable 56 will cause the fingertip 36 to retract as it is drawn inward by the sliding rod 54 moving within and guided by the bushing 52. Consequently, at any instant in time the position of the fingertip 36 depends upon the relative strengths of the force applied to it by the bellows 50, which biases the fingertip 36 to extend outward, and of the force applied to it by the control cable 56, which urges the fingertip 36 to retract inward in opposition to the outward biasing force of the bellows 50. If the fingertip 36 is thus drawn inward far enough, the fingertip 36 contacts the end of the bushing 52 nearest to the fingertip 36. Thus, in addition to guiding the motion of the sliding rod 54, the bushing 52 also mechanically limits the inward retraction of the fingertip 36. The bellows 50 also serves to prevent rotation of the sliding rod 54 in the bushing becuse the bellows is in direct contact with some portion of the sliding rod, as well as the fingertip 36.

Figure 5:
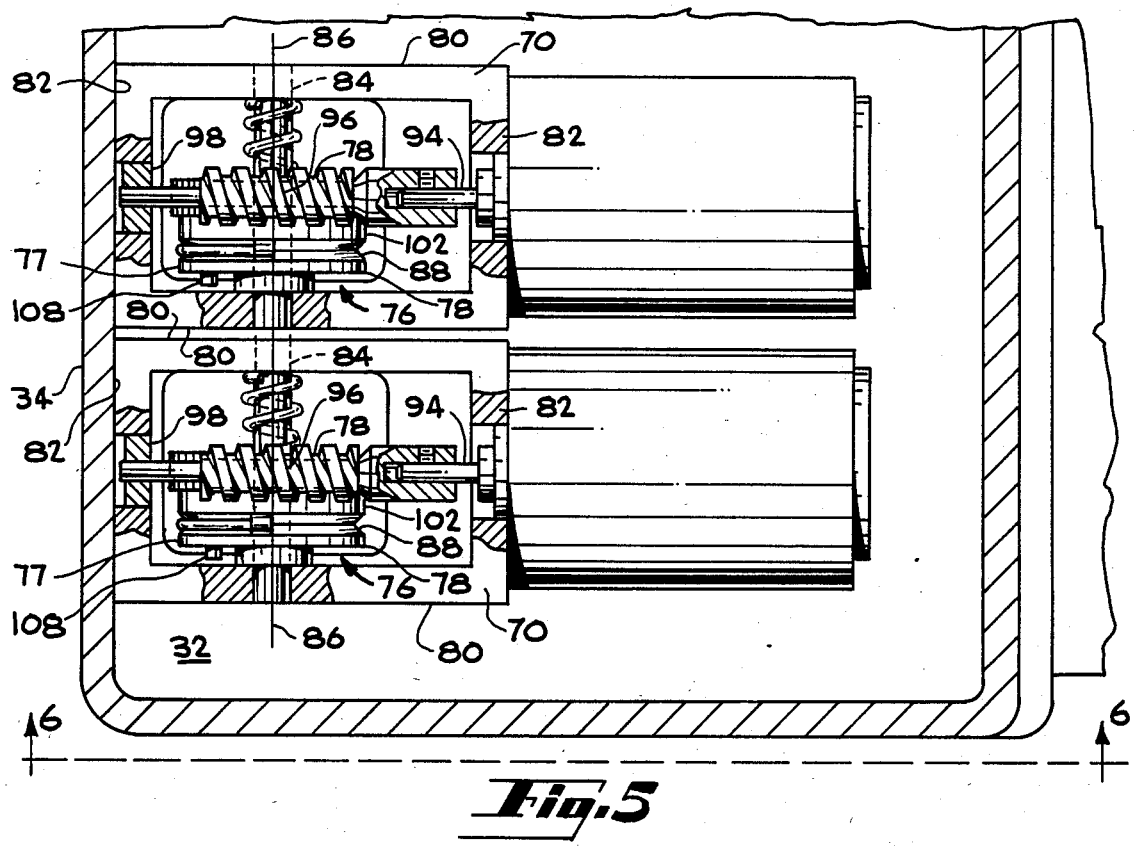
FIG. 5 is a partially cutaway and cross-sectional diagramatic view of the robotic gripper taken along the lines 5—5 of FIG. 2 depicting two motor driven pulleys of the gripper's fingertip control means.
Figure 6:
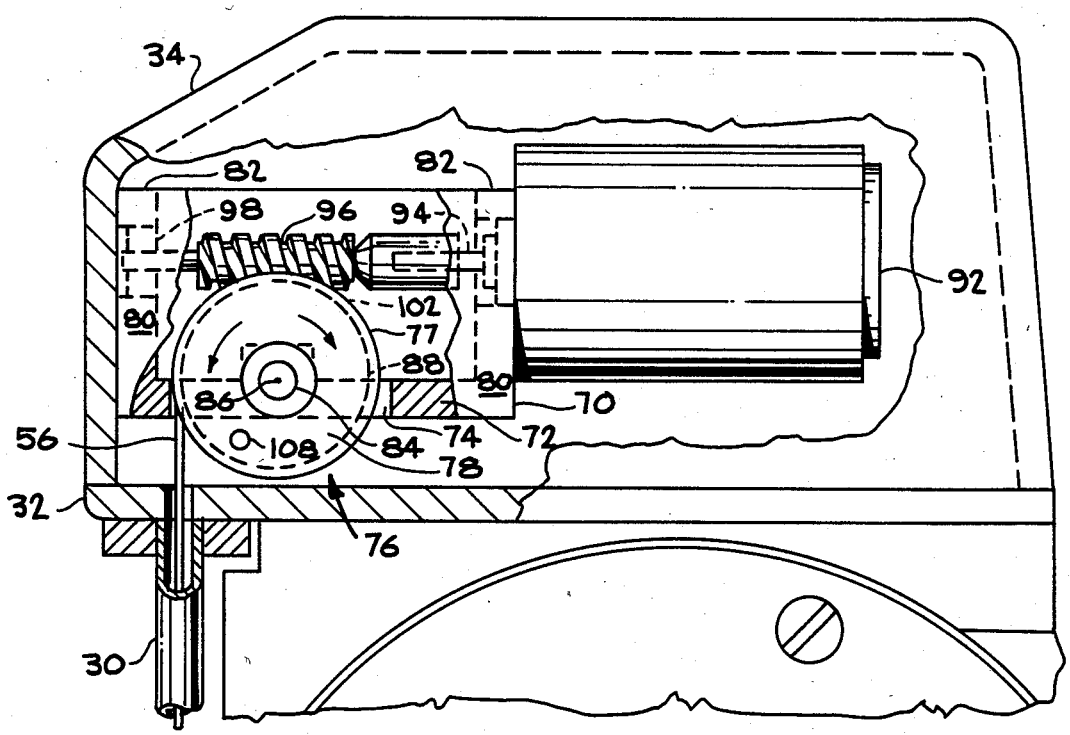
FIG. 6 is a partially cutaway and cross-sectional diagramatic view of the robotic gripper taken along the lines 6—6 of FIG. 5 depicting a side view of one of the motor driven pulleys.
Figure 5A:
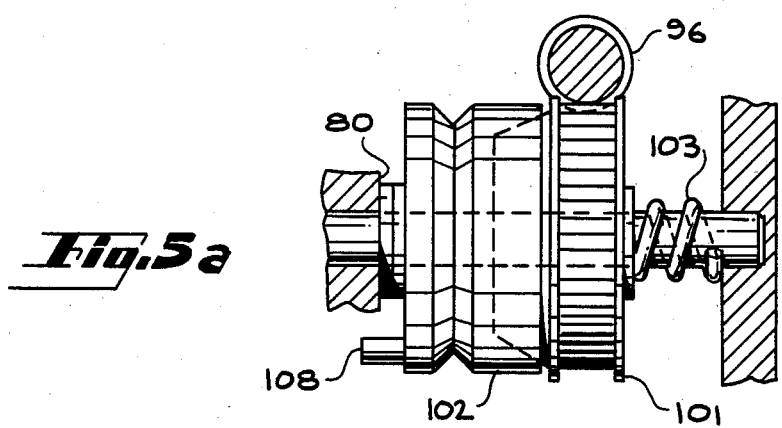
FIGS. 5a and 5b are side and top views of a pulley assembly forming part of the fingertip control means shown in FIG. 5.
Figure 5B:
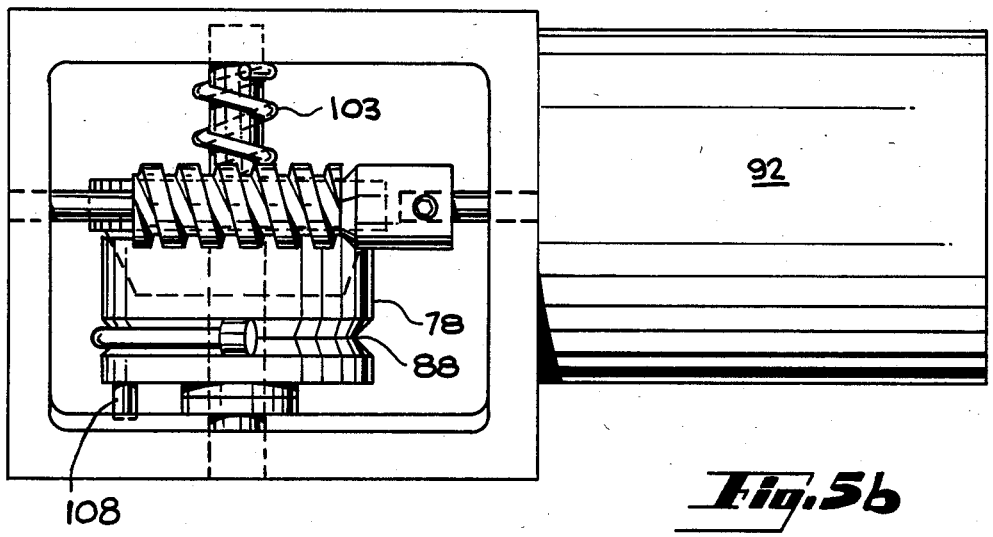
Figure 5C:
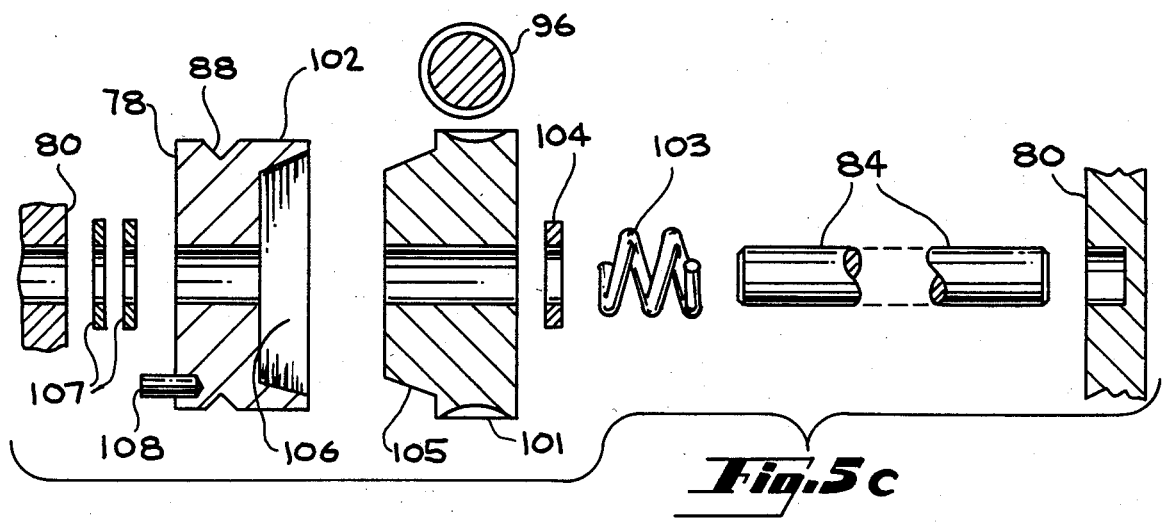

Referring now to FIGS. 5 and 6 at the fingertip control assembly 34, each finger 30 is secured to the base plate 32 while the control cable 56 projects out of the open end of the hollow finger 30 to extend upward into the fingertip control assembly 34 through the base plate 32. Supported within the fingertip control assembly 34 above the base plate 32 are four hollow, cup-shaped gearboxes 70, only two of which are depicted in FIG. 5. Each gearbox 70 has a bottom wall 72 through which a rectangular aperture 74 is formed to receive the lower half of a cylindrically shaped pulley assembly 76. The end surface 78 of each pulley assembly 76 respectively faces a side wall 80 projecting upward from the bottom wall 72 of the gearbox 70. Also projecting upward from the bottom wall 72 of the gearbox 70 are two end walls 82 which span between and close the ends of the side walls 80. Thus each pulley assembly 76 is totally enclosed within the gearbox 70 except for that portion which extends downward through the rectangular aperture 74 toward the base plate 32. Also enclosed within the gearbox 70 is a pulley assembly support shaft 84 having a longitudinal axis 86 which spans between the side walls 80 to support the pulley assembly 76 within the gearbox 70 and to allow its rotation about the longitudinal axis 86. Details of pulley assembly 76 may be understood with reference to FIGS. 5a, 5b and 5c, as well as FIG. 5.

Mounted on the pulley assembly support shaft 84 is a worm gear 101 which functions as the driving member of a torque limiting cone clutch. Also mounted on the shaft is a pulley 102 which functions as the driven member of a torque limiting cone clutch and spring 103 which applies the required axial force between the side wall 80 and worm gear 101 through thrust washers 104. This forces the worm gear cone 105 into engagement with the pulley cup 106 and thrust washers 107, applying reaction force between end surface 78 and wall 80. Pulley cup 106 is a concave recess in pulley 102. Formed into the cylindrical surface 77 of each pulley 102 immediately adjacent to the end surface 78 is a U-shaped groove 88 which circumscribes the pulley 102 parallel to the end surface 78. A section of the length of the control cable 56 projecting out of the open end of the finger 30 at the base plate 32 and extending upward into the fingertip control assembly 34 is partially wrapped about the pulley 102 within the U-shaped groove 88 and its end is secured there. Projecting outward from end surface 78 near the periphery of cylindrical surface 78 is a stop pin 108 which limits the rotation of the pulley by contacting the lower edge of side wall 80. Shaft 84 also carries washers 104 and 107.

Projecting outward from the end walls 82 of each gearbox 70 is a bidirectional electric motor 92 having a drive shaft 94 which is aligned orthogonal to and offset to one side of the pulley support shaft 84. Within the gearbox 70, an elongated worm shaft 96 is aligned colinear with, mates at one end with, and is secured to the end of the drive shaft 94 projecting into the gearbox 70. The worm shaft 96 engages with and extends across the width of the worm gear 101 from the drive shaft 94 to the opposing end wall 82 of the gearbox 70 to be supported there by a bearing 98 secured within the end wall 82.

This arrangement of each pulley assembly, worm shaft 96 and electric motor 92 permits the fingertip control assembly 34 to control the extension and retraction of each individual fingertip 36. Thus, if the electric motor 92 is energized for rotating the worm shaft 96 in a direction which urges the pulley assembly to rotate in the clockwise direction as seen in FIG. 6, such rotation of the pulley assembly 76 will wrap the control cable 56 retracting the fingertip 36 inward against the compressing bellows 50. The magnitude of inward fingertip reaction force is limited by limiting the amount of torque which can be transmitted from motor 92 through the clutch to pulley 102. When the fingertip contacts the wafer edge or the bushing the retraction force is limited by the torque-limiting clutch.

Figure 8:
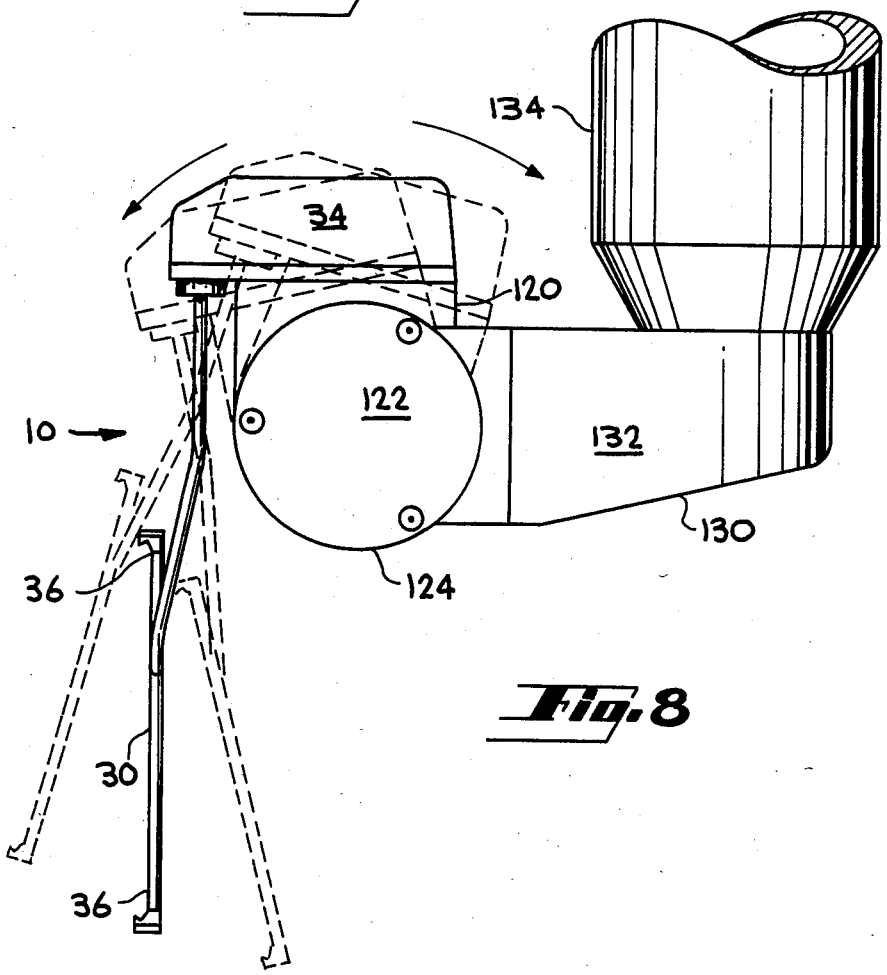
FIG. 8 is a diagramatic plan view of the robotic gripper taken along the lines 8—8 of FIG. 1 depicting movement of the gripper about its elevational rotary joint.

Alternatively, if the electric motor 92 is energized to rotate the pulley assembly 76 in the counterclockwise direction as seen in FIG. 8, the pulley 76 will unwrap control cable 56 allowing the fingertip 36 to extend outward due to the force of the compressed bellows 50. Control cable unwrap is limited when the stop pin contacts the lower edge of the side wall.

Referring again to FIG. 1, the fingertip control assembly 34 of the robotic gripper 10 is supported at one end by a rotating section 120 of an elevational rotary joint 122 upon which the fingertip control assembly 34 rests and to which it is secured. Coupled to and projecting outward to one side of the rotating section 120 of the elevational rotary joint 122 immediately beneath the remaining length of the fingertip control assembly 34 is a fixed section 124 of the elevational rotary joint 122. The fixed section 124 of the elevational rotary joint 122 is itself supported along its surface opposite to the fingers 30 by a rotating section 130 of an azimuthal rotary joint 132 to which it is secured. The rotating section 130 of the azimuthal rotary joint 132 is coupled to and depends from a fixed section 134 of the aximuthal rotary joint 132.

Figure 7:
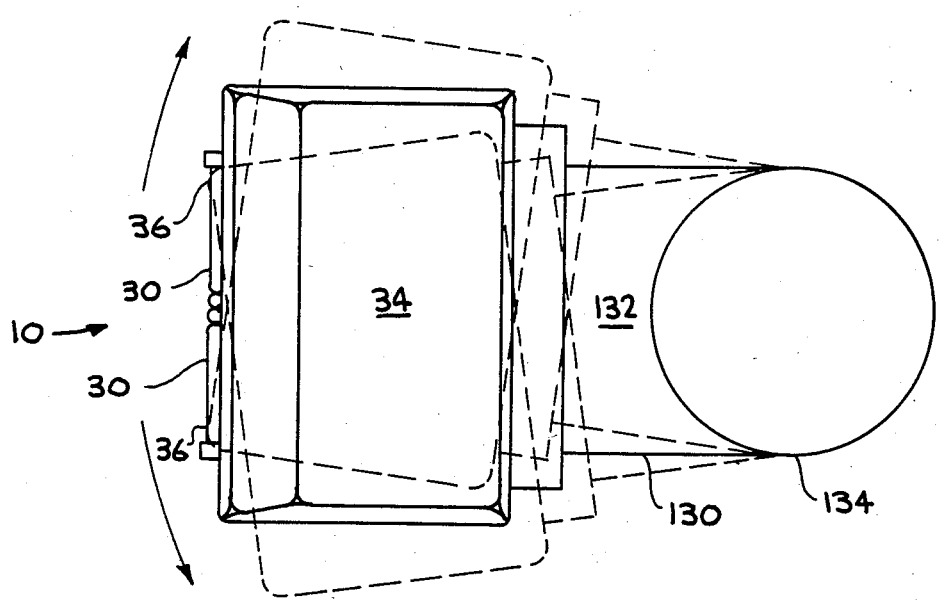
FIG. 7 is a diagramatic plan view of the robotic gripper taken along the lines 7—7 of FIG. 1 depicting movement of the gripper about its azimuthal rotary joint.

As depicted in FIG. 7, turning the rotating section 130 of the azimuthal rotary joint 132 with respect to the fixed section 134 thereof allows the robotic gripper 10 to alter the orientation of a gripped integrated circuit wafer 12 by changing the azimuth of its planar surface 16. Similarly, as depicted in FIG. 8, turning the rotating section 120 of the elevational rotary joint 122 with respect to the fixed section 124 thereof allows the robotic gripper 10 to alter the orientation of a gripped integrated circuit wafer 12 by changing the elevation of its planar surface 16. Employing these two degrees of rotational freedom with the robotic gripper 10 positioned above a wafer carrier 14, the robotic gripper 10 can be operated to align its fingers 30 parallel to the mated pairs of slots 20 in the wafer carrier 14. Referring to FIGS. 1, 4 and 8 with the fingers 30 and their fingertips 36 properly aligned immediately adjacent the rearwardmost integrated circuit wafer 12, the fingers 30 can be inserted into the wafer carrier 14 until the extended fingertips 36 are positioned outward to one side of and about the edge surface 18 of the integrated circuit wafer 12. After a slight movement of the fingers 30 toward the intregrated circuit wafer 12 nearest to the projecting ends of the lips 44 to align the edge surface 18 of the integrated circuit wafer 12 with the V-shaped notches 46, the fingertips 36 may be retracted inward to grip the edge surface 18 of the integrated circuit wafer 12. The robotic gripper 10 may then be withdrawn, thereby completing the operation of taking the integrated circuit wafer 12 from the water carrier 14. After the integrated circuit wafer 12 has been thus raised completely out of the wafer carrier 14, the rotating section 130 of the azimuthal rotary joint 132 may be turned with respect to the fixed section 134 to position the integrated circuit wafer 12 at a processing station of a wafer processing machine located to either side of the wafer carrier 14. After the integrated circuit wafer 12 has been processed, the preceding operations for taking the integrated circuit wafer 12 from the wafer carrier 14 may be reversed so the robotic gripper 10 may deliver the integrated circuit wafer 12 back into a mated pair of slots 20 in the wafer carrier 14.

While the robotic gripper 10 of the present invention as depicted in FIGS. 5 and 6 is illustrated with only a limited range of rotational movement, such a limited range of movement is not inherent to the robotic gripper 10 but rather is due to the particular structures of the rotary joints 122 and 132 which are especially adapted for the particular operations of taking vertically oriented integrated circuit wafers 12 from or delivering them to the wafer carrier 14. Alternative structures for the joints 122 and 130 which allow the robotic gripper 10 of the present invention to pick up, support and release an object disposed in any orientation by contacting only that object's edge surface are known and may be easily adapted for use in conjunction with the robotic gripper 10 of the present invention.

By providing enclosures for the rotating and sliding members of robotic gripper 10, particle generation from wear surfaces is confined. This is significant in handling wafers and similar particle-sensitive materials.

I claim:

1. A robotic gripper as may be used for picking up, supporting, and releasing a disk-shaped object by mechanically engaging only said object's edge surface comprising,
    a plurality of fingers having tips which may be extended outward from or retracted inward to said object's edge surface, the tips of said fingers being respectively located at individual positions spaced about said ojbect's edge surface, said plurality of fingers being mechanically joined together into a unitary assembly at a single location lying within the perimeter of the area enclosed by a polygon having its verticies at each of the fingertips, and
    fingertip actuator means for extending the tips of said fingers outward from or withdrawing them inward toward said object's edge surface.

2. The robot gripper of claim 1 wherein a thin disk-shaped object is to be picked up, supported, and released and wherein said fingers project radially outward from the single location at which said fingers are joined together, the tips of said fingers being located at points which divide the shape of said disk-shaped object's circumference into a plurality of arcs.

3. The robotic gripper of claim 2 wherein each fingertip is notched to receive the edge surface of said disk-shaped object.

4. A robotic gripper as may be used for picking up, supporting, and releasing a disk-shaped object by mechanically engaging only said object's edge surface comprising,
    a plurality of fingers having tips which may be extended outward from or retracted inward to said object's edge surface, the tips of said fingers being respectively located at individual positions spaced apart about said object's edge surface, and
    fingertip actuator means totally enclosed within the outer surface of said fingers for extending the tips of said fingers outward from or withdrawing them inward toward said object's edge surface, wherein each finger is hollow and adapted for applying a force to the fingertip thereof which urges that fingertip to extend outward, and wherein the fingertips are urged to retract inward overcoming the force urging them to extend outward by a fingertip control cable enclosed within and extending along the length of said hollow finger.

5. The robotic gripper of claim 4 wherein a hollow bellows located along the length of said finger intermediate the fingertip and the single location at which the plurality of said fingers are joined together provides the force urging the fingertip to extend outward.

6. The robotic gripper of claim 5 wherein said each bellows internally contacts said fingertip actuator means and a fingertip thereby preventing fingertip rotation.

7. A robotic gripper as may be used for picking up, supporting, and releasing a disk-shaped object by mechanically engaging only said object's edge surface comprising,
    a plurality of fingers having tips which may be extended outwards from or retracted inward to said object's edge surface, the tips of said fingers being respectively located at individual positions spaced about said object's edge surface, fingertip actuator means totally enclosed within the outer surface of said fingers for extending the tips of said fingers outward from or withdrawing them inward toward said object's edge surface, and fingertip control means for individually controlling the extension of each fingertip outward and its retraction inward, said fingertip control means including a base plate from which said fingers project.

8. The robotic gripper of claim 7 wherein each finger is hollow and is adapted for applying a force to the fingertip thereof which urges that fingertip to extend outward, and wherein the fingertips are urged to retract inward overcoming the force urging them to extend outward by a fingertip control cable enclosed within and extending along the length of said hollow finger.

9. The robotic gripper of claim 8 wherein a hollow bellows located along the length of said finger intermediate the fingertip and the single location at which the plurality of said fingers are joined together provides the force urging the fingertip to extend outward.

10. The robotic gripper of claim 8 wherein said fingertip control means includes an individual, motor driven pulley for controlling the outward extension and inward retraction of each fingertip, each such motor driven pulley having a section of the length of said fingertip control cable wrapped about and secured to a segment of its periphery.

11. The robotic gripper of claim 10 further comprising extension limit means for limiting the outward extension of each individual fingertip.

12. The robotic gripper of claim 11 wherein each motor driven pulley includes a pin projecting outward from one of its planar surfaces which mechanically limits the outward extension of the fingertip upon the pin's engagement with the structure of the fingertip control means from which said fingers project.

13. The robotic gripper of claim 11 wherein each motor is coupled to a pulley by clutch means for limiting torque transmitted to each pulley.

14. A robotic gripper, as may be used for picking up, supporting and releasing a disk-shaped object by mechanically engaging said object's edge surface comprising, a base plate, a plurality of fingers extending in the same direction from the base, the fingers each having a curved central region and an outward tip, the curved central region of the fingers, as a group, formed so that outward tips of the fingers are located at polygonal vertices within which the outer peripheral edge circumference of a disk-shaped object may be enclosed, the tips having means for engaging the peripheral edge of said object, and means for extending and withdrawing said fingers whereby objects placed within said vertices may be picked up and deposited by edge contact.

15. The robot gripper of claim 14 wherein each finger is hollow, having a cable therein along the curved central region, the cable having an outward end connected to the tip, the tip elastically joined to the central region whereby cable motion causes extension and retraction of the tip relative to the central region.

16. The robot gripper of claim 14 wherein the tip is connected to the central region by means of a bellows.

17. The robot gripper of claim 15 wherein said fingers are curved, the outward tips forming a planar X pattern, said tips having wafer gripping notches connected thereto extending out of the plane of said X pattern.

18. The robot gripper of claim 17 wherein said wafer gripping notches are extensible beyond the edge of said object.

19. The robot gripper of claim 15 wherein said base supports a plurality of motor driven pulleys, each pulley having a cable trained about the periphery thereof.

20. The robot gripper of claim 14 wherein said fingers and tips are aligned such that the overall dimensional width of the apparatus passes between wafers in a wafer carrier.

21. The robot gripper of claim 14 wherein said fingers are joined to form a unitary assembly.

22. A robotic gripper as may be used for picking up, supporting, and releasing a thin, disk-shaped object such as an integrated circuit wafer by mechanically engaging only said object's edge surface, said object being disposed in any orientation, comprising, a plurality of fingers having fingertips which may be extended outward from or retracted inward to said object's edge surface, said plurality of fingers being mechanically joined together into a unitary assembly at a single location lying within the perimeter of the area enclosed by a polygon having its vertices at each of the fingertips, said fingers projecting radially outward from the location at which they are joined together to dispose the tips thereof at points which divide the shape of said disk-shaped object's circumference into a plurality of arcs, each fingertip being formed with a notch for receiving the edge surface of said disk-shaped object, said fingers being formed substantially coplanar with the notched portion of the tips thereof projecting outward from that plane, and fingertip actuator means for extending the fingertips of said fingers outward from or withdrawing them inward toward said object's edge surface.

23. The robotic gripper of claim 22 further including means for enclosing wear surfaces of said fingers and said fingertip actuator means.

* * * * *

UNITED STATES PATENT AND TRADEMARK OFFICE
CERTIFICATE OF CORRECTION

PATENT NO. : 4,586,743
DATED : May 6, 1986
INVENTOR(S) : Alan T. Edwards et al.

It is certified that error appears in the above—identified patent and that said Letters Patent is hereby corrected as shown below:

Column 2, line 6, the words "If a water" should read
- -If a wafer- -.

Column 8, lines 51-52, the words "fingertip reaction force" should read - -fingertip retraction force- -.

Claim 17, line 1, the words "claim 15" should read - -claim 14- -

Signed and Sealed this

Eighteenth Day of November, 1986

*Attest:*

DONALD J. QUIGG

*Attesting Officer*  *Commissioner of Patents and Trademarks*